(12) United States Patent
Sakamoto et al.

(10) Patent No.: US 7,277,300 B2
(45) Date of Patent: Oct. 2, 2007

(54) VENT GRID AND ELECTRONIC APPARATUS EMPLOYING THE SAME

(75) Inventors: Shigeo Sakamoto, Kawasaki (JP); Kenji Nagase, Kawasaki (JP); Kazuaki Taya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/189,929

(22) Filed: Jul. 27, 2005

(65) Prior Publication Data

US 2006/0196692 A1    Sep. 7, 2006

(30) Foreign Application Priority Data

Mar. 1, 2005    (JP)    ............... 2005-055947

(51) Int. Cl.
 *H09O 9/00*    (2006.01)
(52) U.S. Cl. ............... 361/816; 361/800; 361/818; 361/799; 361/753; 361/692; 174/350; 174/357; 174/355
(58) Field of Classification Search ............... 361/692, 361/800, 693, 752, 753, 799, 816, 818; 174/350, 174/355, 357
See application file for complete search history.

(56) References Cited

U.S. PATENT DOCUMENTS

| | | | | |
|---|---|---|---|---|
| 3,231,663 A | * | 1/1966 | Schwartz ............... | 174/394 |
| 4,581,608 A | * | 4/1986 | Aftergut et al. ............... | 345/88 |
| 4,672,509 A | * | 6/1987 | Speraw ............... | 361/687 |
| 5,740,015 A | * | 4/1998 | Donegan et al. ............ | 361/699 |
| 5,804,761 A | * | 9/1998 | Donegan et al. ............ | 174/15.1 |
| 5,895,885 A | * | 4/1999 | Kunkel ............... | 174/383 |
| 5,910,639 A | * | 6/1999 | Kunkel ............... | 174/383 |
| 6,011,504 A | * | 1/2000 | Tan ............... | 342/4 |
| 6,054,647 A | * | 4/2000 | Ridener ............... | 174/392 |
| 6,147,302 A | * | 11/2000 | Matsuo et al. ............... | 174/390 |
| 6,749,498 B2 | * | 6/2004 | Pfister ............... | 454/184 |
| 6,870,092 B2 | * | 3/2005 | Lambert et al. ............ | 174/355 |
| 6,947,294 B2 | * | 9/2005 | Lin et al. ............... | 361/818 |

FOREIGN PATENT DOCUMENTS

JP    2004-259910    9/2004

* cited by examiner

*Primary Examiner*—Dean A. Reichard
*Assistant Examiner*—Dameon E. Levi
(74) *Attorney, Agent, or Firm*—Westerman, Hattori, Daniels & Adrian, LLP.

(57) ABSTRACT

A vent grid has parallel first electrically-conductive members and parallel second electrically-conductive members intersecting with the first electrically-conductive members. The intersection between the first and second electrically-conductive members is forced to have a larger cross-sectional area. The characteristic impedance thus increases. The electric current flowing through the first and second electrically-conductive members turns over at the boundary between the intersection and the first and second electrically-conductive members. The flow of the electric current is in this manner interrupted. Accordingly, the vent grid fails to induce electromagnetic wave. Moreover, the electrically-conductive piece is merely located at a corner of the opening. Decrease in the percentage of the opening is thus suppressed to the utmost per a unit area. A sufficient airflow can be established through the vent grid. Decrease in the cooling efficiency and performance can be suppressed.

3 Claims, 6 Drawing Sheets

VENT GRID AND ELECTRONIC APPARATUS EMPLOYING THE SAME

BACKGROUND OF THE INVENTION

1. Field of the Invention

The present invention relates to a vent grid utilized in an electronic apparatus, for example.

2. Description of the Prior Art

A computer includes an enclosure. A vent grid is incorporated in the back wall of the enclosure, for example. The vent grid defines a matrix of square openings, for example. A cooling fan is enclosed inside the enclosure. The cooling fan serves to generate airflow circulating through the enclosure. The airflow absorbs heat from a motherboard likewise enclosed inside the enclosure. The heated airflow is discharged out of the enclosure through the openings of the vent grid. The circulation of the airflow in this manner contributes to establishment of a lower temperature inside the enclosure.

An electronic circuit element such as a central processing unit, CPU, is mounted on the motherboard. The central processing unit radiates electromagnetic wave. An increased clock frequency of the central processing unit causes leakage of the electromagnetic wave out of the enclosure through the openings of the vent grid. The leaked electromagnetic wave sometimes causes erroneous performance of the peripherals. If the area of the individual opening is sufficiently reduced as compared with the wavelength of the electromagnetic wave, the leakage of the electromagnetic wave can be prevented. However, a reduced area of the opening leads to a deteriorated efficiency of the cooling fan and cooling performance.

Moreover, the vent grid is usually made of an electrically-conductive material such as an iron plate. When the electromagnetic wave radiating from the electronic circuit element acts on the vent grid, flow of electric current is generated in the vent grid. The electromagnetic wave is induced in the vent grid in response to the flow of the electric current. The electromagnetic wave passes directly through the vent grid while the electromagnetic wave is radiated from the vent grid. The generation of the electromagnetic wave should be suppressed.

SUMMARY OF THE INVENTION

It is accordingly an object of the present invention to provide a vent grid and an electronic apparatus capable of efficiently avoiding induction of electromagnetic wave without deteriorating cooling efficiency.

According to a first aspect of the present invention, there is provided a vent grid comprising: parallel first electrically-conductive members extending in a first direction, said first electrically-conductive members having a constant cross-sectional area; parallel second electrically-conductive members extending in a second direction, intersecting with the first direction, so as to intersect with the first electrically-conductive members, said second electrically-conductive members having a constant cross-sectional area; and an electrically-conductive piece located at a corner of an opening surrounded by adjacent ones of the first electrically-conductive members and adjacent ones of the second electrically-conductive members, said electrically-conductive piece connecting first and second electrically-conductive members, intersecting with each other at the corner, to each other.

The vent grid allows establishment of a splay at the corner of the opening based on the electrically-conductive piece. The electrically-conductive piece serves to increase the cross-sectional area of the first electrically-conductive member across the second electrically-conductive member intersecting with the first electrically-conductive member. The electrically-conductive piece likewise serves to increase the cross-sectional area of the second electrically-conductive member across the first electrically-conductive member intersecting with the second electrically-conductive member. The intersection between the first and second electrically-conductive members is forced to have a larger cross-sectional area. The characteristic impedance thus increases. The electric current flowing through the first and second electrically-conductive members turns over at the boundary between the intersection and the first and second electrically-conductive members. The flow of the electric current is in this manner interrupted. Accordingly, the vent grid fails to induce electromagnetic wave. Moreover, the electrically-conductive piece is merely located at a corner of the opening. Decrease in the percentage of the opening is thus suppressed to the utmost per a unit area. A sufficient airflow can be established through the vent grid. Decrease in the cooling efficiency and performance can be suppressed. The vent grid of the type may allow integration of the electrically-conductive piece with the first and second electrically-conductive members.

According to a second aspect of the present invention, there is provided an electronic apparatus having a vent grid, said vent grid comprising: parallel first electrically-conductive members extending in a first direction, said first electrically-conductive members having a constant cross-sectional area; parallel second electrically-conductive members extending in a second direction, intersecting with the first direction, so as to intersect with the first electrically-conductive members, said second electrically-conductive members having a constant cross-sectional area; and an electrically-conductive piece located at a corner of an opening surrounded by adjacent ones of the first electrically-conductive members and adjacent ones of the second electrically-conductive members, said electrically-conductive piece connecting first and second electrically-conductive members, intersecting with each other at the corner, to each other.

The electronic apparatus allows establishment of a splay at the corner of the opening based on the electrically-conductive piece in the vent grid in the aforementioned manner. The electrically-conductive piece serves to increase the cross-sectional area of the first electrically-conductive member across the second electrically-conductive member intersecting with the first electrically-conductive member. The electrically-conductive piece likewise serves to increase the cross-sectional area of the second electrically-conductive member across the first electrically-conductive member intersecting with the second electrically-conductive member. The intersection between the first and second electrically-conductive members is forced to have a larger cross-sectional area. The characteristic impedance thus increases. The electric current flowing through the first and second electrically-conductive members turns over at the boundary between the intersection and the first and second electrically-conductive members. The flow of the electric current is in this manner interrupted. Accordingly, the vent grid fails to induce electromagnetic wave. Moreover, the electrically-conductive piece is merely located at a corner of the opening. Decrease in the percentage of the opening is thus suppressed to the utmost per a unit area. A sufficient airflow can be established through the vent grid. Decrease in the cooling efficiency and performance can be suppressed. The electronic apparatus may allow integration of the electrically-conductive piece with the first and second electrically-conductive members in the vent grid.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
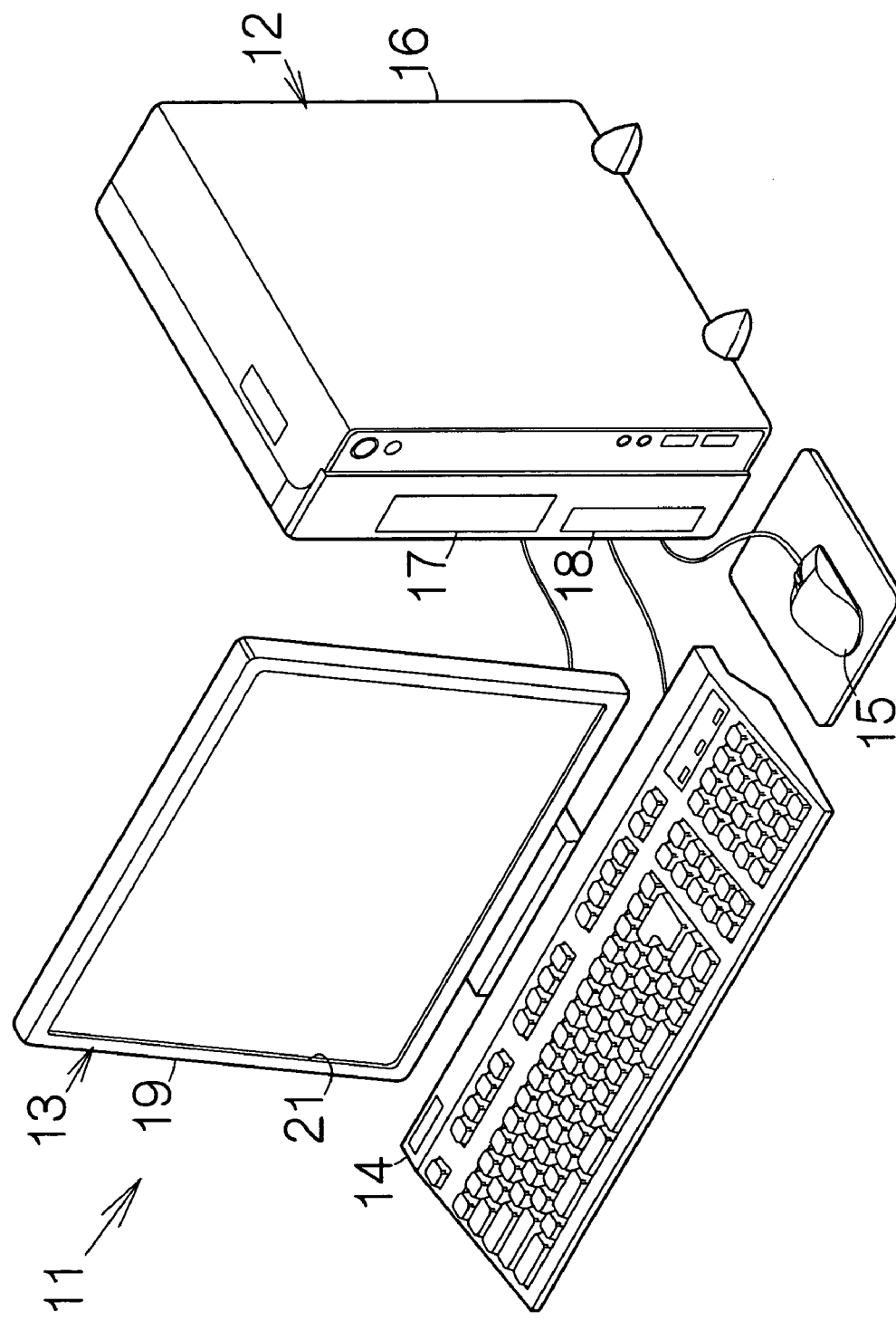
FIG. 1 is a perspective view schematically illustrating the structure of a desktop computer system as an example of an information processing apparatus.

FIG. 1 schematically illustrates the structure of a desktop computer system as an example of an information processing apparatus. The desktop computer system 11 includes a computer 12 as an example of an electronic apparatus and a display apparatus 13 connected to the computer 12. Input devices such as a keyboard 14, a mouse 15, and the like, are also connected to the computer 12.

The computer 12 includes a box-shaped enclosure 16. A motherboard is enclosed within the enclosure 16. As conventionally known, electronic circuit elements such as a central processing unit, CPU, a memory, and the like, are mounted on the motherboard. The central processing unit executes various processing and calculation based on software programs and data temporarily stored in the memory, for example. The software programs and data may be stored in a mass storage such as a hard disk drive, HDD, likewise enclosed inside the enclosure 16. The user is allowed to input various data and instructions to the central processing unit through the keyboard 14 and the mouse 15.

A flexible disk drive, FDD, 17, a recording disk drive 18, and the like are also incorporated in the enclosure 16. The flexible disk drive 17 and the recording disk drive 18 are allowed to receive a diskette, a CD-ROM, a DVD-ROM, and the like, through front openings. The flexible disk drive 17 and the recording disk drive 18 is allowed to read out data or/and software programs out of the diskette and the CD-ROM or DVD-ROM, for example.

The display apparatus 13 includes a display enclosure 19. A flat display panel such as a liquid crystal display (LCD) panel is enclosed inside the display enclosure 19, for example. A rectangular window 21 is defined in the display enclosure 19. The screen of the LCD panel window 21 is exposed inside the window 21. Various texts and/or graphics are displayed on the screen of the LCD panel based on the operation of the central processing unit.

Figure 2:
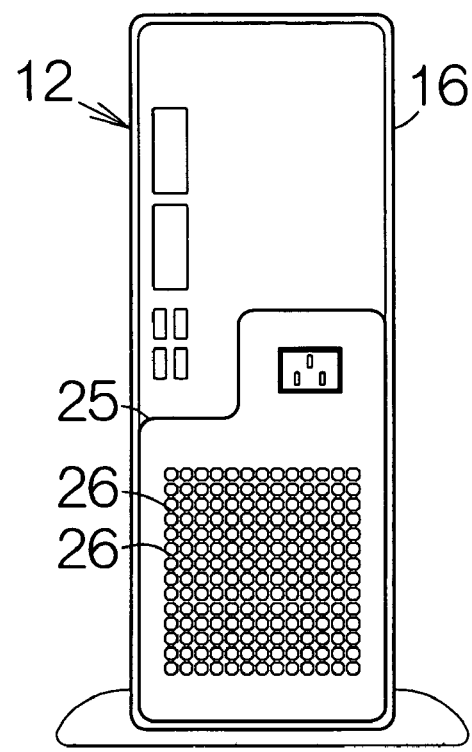
FIG. 2 is a rear view of a computer of the desktop computer system.

As shown in FIG. 2, a vent grid 25 is fitted in the back wall of the enclosure 16 in the computer 12. The vent grid 25 defines a matrix of openings 26, 26, . . . . The individual openings 26 serve to connect the inner space of the enclosure 16 to the outer space. The vent grid 25 may be made of an electrically-conductive metallic plate, for example. An iron plate may serve as the metallic plate. Coupling pieces such as screws, not shown, may be employed to fix the vent grid 25 to the enclosure 16, for example.

A cooling fan, not shown, is enclosed inside the enclosure 16. The cooling fan serves to generate airflow within the enclosure 16. The generated airflow circulates along the front and back surfaces of the motherboard. The airflow absorbs heat from the motherboard. The heated airflow is guided toward the vent grid 25. The airflow is then discharged out of the enclosure 16 through the openings 26 of the vent grid 25. The airflow in this manner promotes the radiation of heat from the electronic circuit elements on the motherboard. Rise in temperature can thus be avoided in the enclosure 16.

Figure 3:
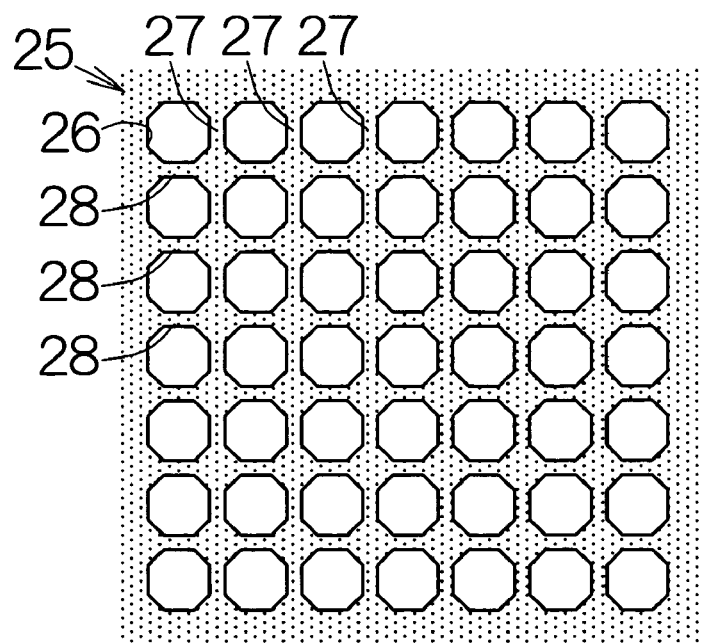
FIG. 3 is an enlarged partial plan view schematically illustrating the structure of a vent grid.

As shown in FIG. 3, the vent grid 25 includes parallel first electrically-conductive members 27, 27, . . . , and parallel second electrically-conductive members 28, 28, . . . intersecting with the first electrically-conductive members 27. The first electrically-conductive members 27 are arranged at constant intervals. The second electrically-conductive members 28 are likewise arranged at constant intervals. The individual opening 26 is surrounded by the adjacent first electrically-conductive members 27, 27 and the adjacent second electrically-conductive members 28, 28, so that the individual opening 26 is formed in a square shape. The first electrically-conductive members 27 extend in a first direction. The first electrically-conductive members 27 have a constant cross-sectional area. The second electrically-conductive members 28 extend in a second direction intersecting with the first direction. The second electrically-conductive members 28 likewise have a constant cross-sectional area. Here, the second electrically-conductive members 28 have a cross-sectional area identical to that of the first electrically-conductive members 27. The second direction is set perpendicular to the first direction.

Figure 4:
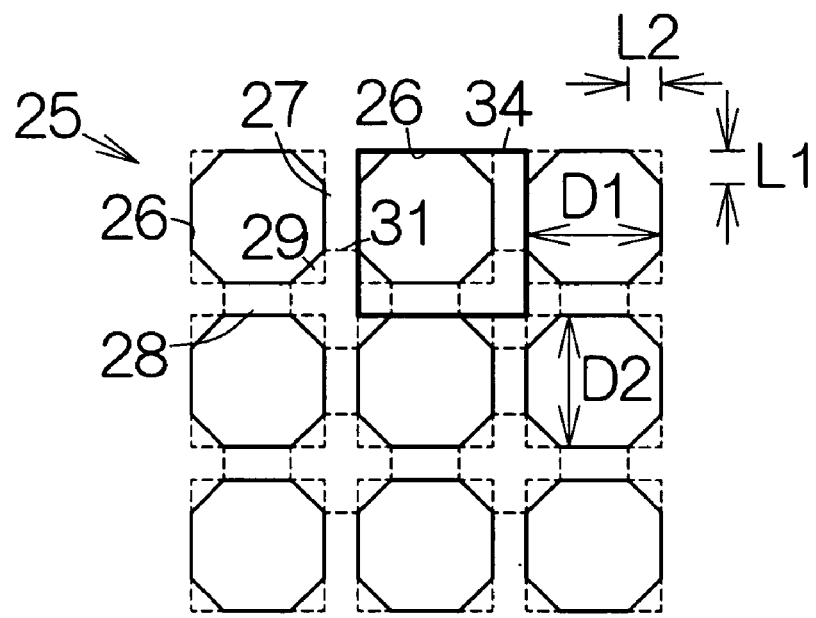
FIG. 4 is an enlarged partial plan view of the vent grid according to an embodiment of the present invention.

As shown in FIG. 4, electrically-conductive pieces 29 are located at four corners of the individual openings 26. The individual electrically-conductive piece 29 serves to connect the first and second electrically-conductive members 27, 28, intersecting with each other at the corner, to each other. The electrically-conductive piece 29 extends along the first and second electrically-conductive members 27, 28 from the apex of the corner. A splay is in this manner formed at all the corners of the opening 26. The splay may be defined based on a straight line, for example. The electrically-conductive piece 29 serves to increase the cross-sectional area of the first electrically-conductive member 27 across the second electrically-conductive member 28 intersecting with the first electrically-conductive member 27. The electrically-conductive piece 29 also serves to increase the cross-sectional area of the second electrically-conductive member 28 across the first electrically-conductive member 27 intersecting with the second electrically-conductive member 28. The electrically-conductive piece 28 serves to establish a crossing section 31 at the intersection between the first and second electrically-conductive members 27, 28. The crossing section 31 has a cross-sectional area larger than that of the first and second electrically-conductive members 27, 28.

The vent grid 25 is allowed to have the crossing sections 31 having a larger cross-sectional area. The characteristic impedance increases at the crossing sections 31. Electric current flowing through the first and second electrically-conductive members 27, 28 turns over at the boundary between the crossing section 31 and the first and second electrically-conductive members 27, 28. The flow of the electric current is in this manner interrupted. Accordingly, the vent grid 25 serves to induce less electromagnetic wave. Moreover, the electrically-conductive pieces 29 are merely located at the corners of the openings 26. Decrease in the percentage of the openings 26 is thus suppressed to the utmost per a unit area. A sufficient airflow can be established through the vent grid 25. Decrease in the cooling efficiency or performance of the cooling fan can be suppressed.

Figure 5:
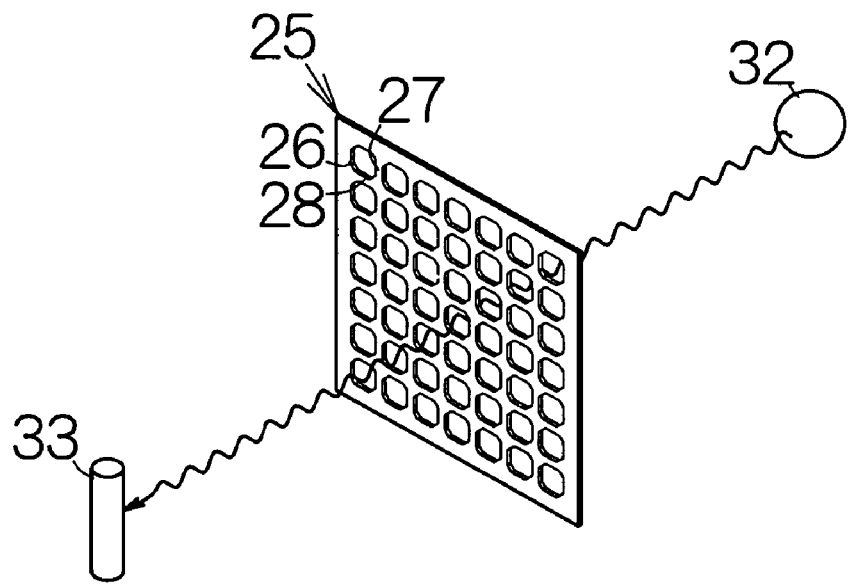
FIG. 5 is a perspective view schematically illustrating the structure of a model in simulation.
Figure 6:
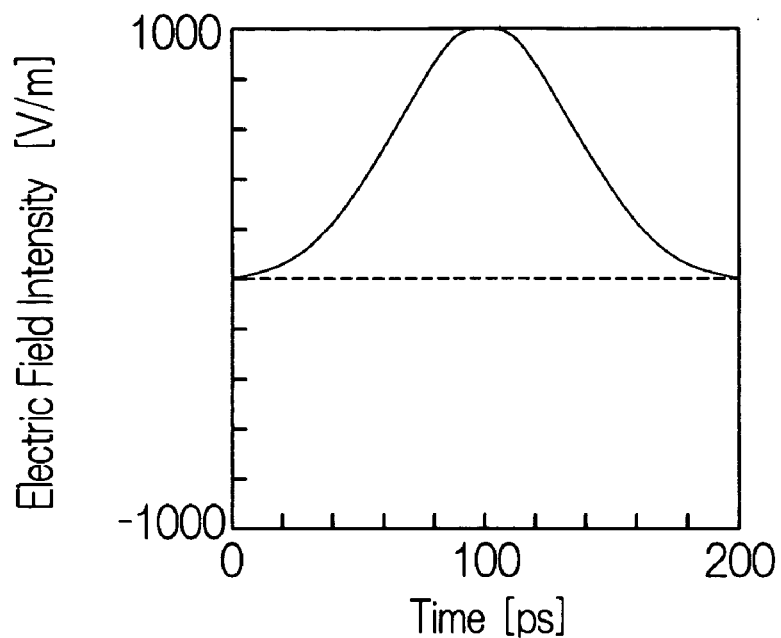
FIG. 6 is a graph showing the relationship between the electric field intensity and the time.
Figure 7:
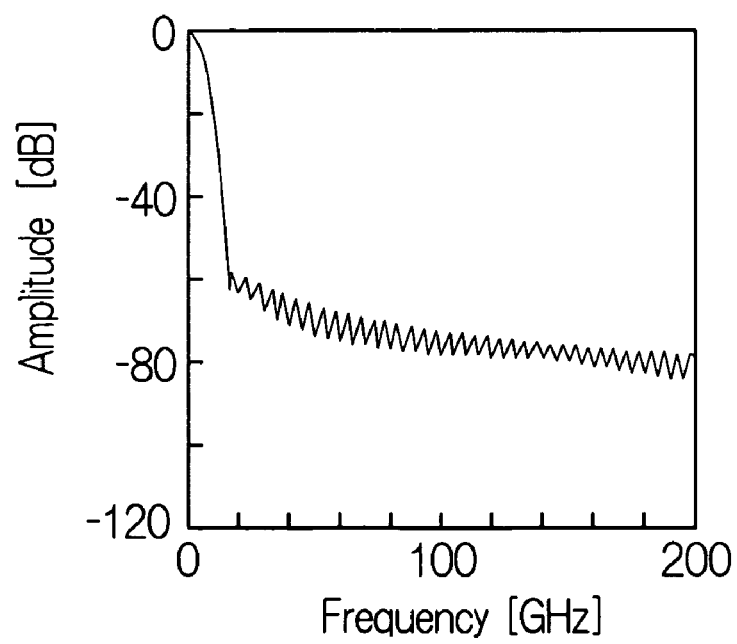
FIG. 7 is a graph showing the relationship between the amplitude and the frequency.

The inventors have observed the performance of the vent grid 25 according to the present invention. The inventors have implemented simulations based on computer software. As shown in FIG. 5, a wave source 32 and an antenna 33 were established in the simulation. The wave source 32 served to radiate electromagnetic wave. The antenna 33 was designed to receive the electromagnetic wave radiated from the wave source 32. The vent grid 25 was established between the wave source 32 and the antenna 33 in the simulation. The wave source 32 utilized a temporal waveform having a predetermined frequency component. Here, the Gaussians waveform was employed. As shown in FIG. 6, the electric field intensity of 1,000 [V/m] was established over a time period of 200 [ps]. As shown in FIG. 7, a relative amplitude was set in the frequency bandwidth ranging from 0 [GHz] to 200 [GHz].

First and second examples of the vent grid 25 according to the invention and a comparative example were prepared in the simulation. As shown in FIG. 4, the constant intervals D1 was set at 8 [mm] between the first electrically-conductive members in the vent grids of the invention and the comparative example. The constant intervals D2 was likewise set at 8 [mm] between the second electrically-conductive members in the vent grids of the invention and the comparative example. The length L1 and width L2 of the electrically-conductive pieces 29 were set at 1 [mm], respectively, in the first example of the invention. The length L1 and width L2 of the electrically-conductive pieces 29 were set at 2 [mm], respectively, in the second example of the invention. The electrically-conductive pieces 29 were omitted from the comparative example.

Figure 8:
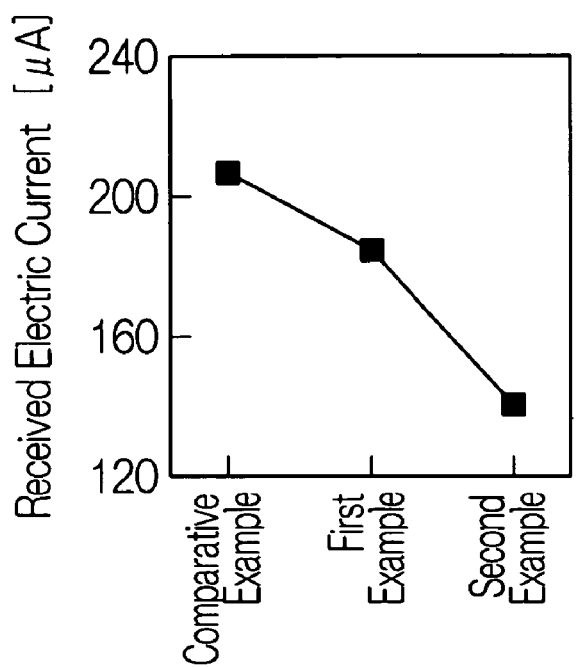
FIG. 8 is a graph showing the magnitude of the received electric current at an antenna.

The electromagnetic wave was transmitted from the wave source 32 to the antenna 33 in the simulation. The inventors calculated the amplitude of the waveform of the received electric current flowing through the antenna 33 based on the received electromagnetic wave. As shown in FIG. 8, the received electric current [μA] decreased in the first example of the invention as compared with the comparative example. The received electric current [μA] considerably decreased in the second example of the invention as compared with the comparative example. It has been confirmed that the electrically-conductive pieces 29 surely serve to avoid induction of electromagnetic wave at the vent grid 25.

Figure 9:
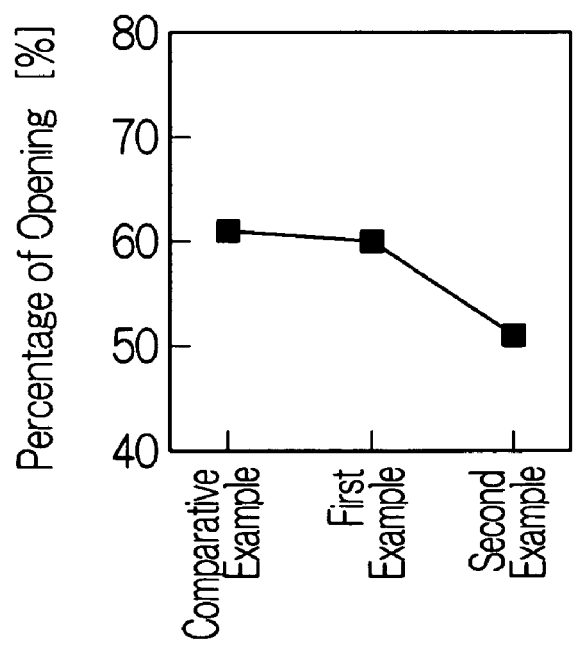
FIG. 9 is a graph showing the magnitude of the percentage of the opening in the vent grid.

As shown in FIG. 9, only a slight decrease was observed in the percentage [%] of the opening for the first and second examples of the invention as compared with the comparative example. It has been confirmed that the cooling fan is prevented from suffering from a deteriorated cooling efficiency and performance. In particular, the first example surely avoids decrease in the percentage of the opening and the induction of electromagnetic wave as compared with the comparative example, as shown in FIGS. 8 and 9. Here, the percentage of the opening was defined as the percentage of the opening 26 in a square area 34 including the opening 26 and the first and second electrically-conductive members 27, 28, as shown in FIG. 4.

Figure 10:
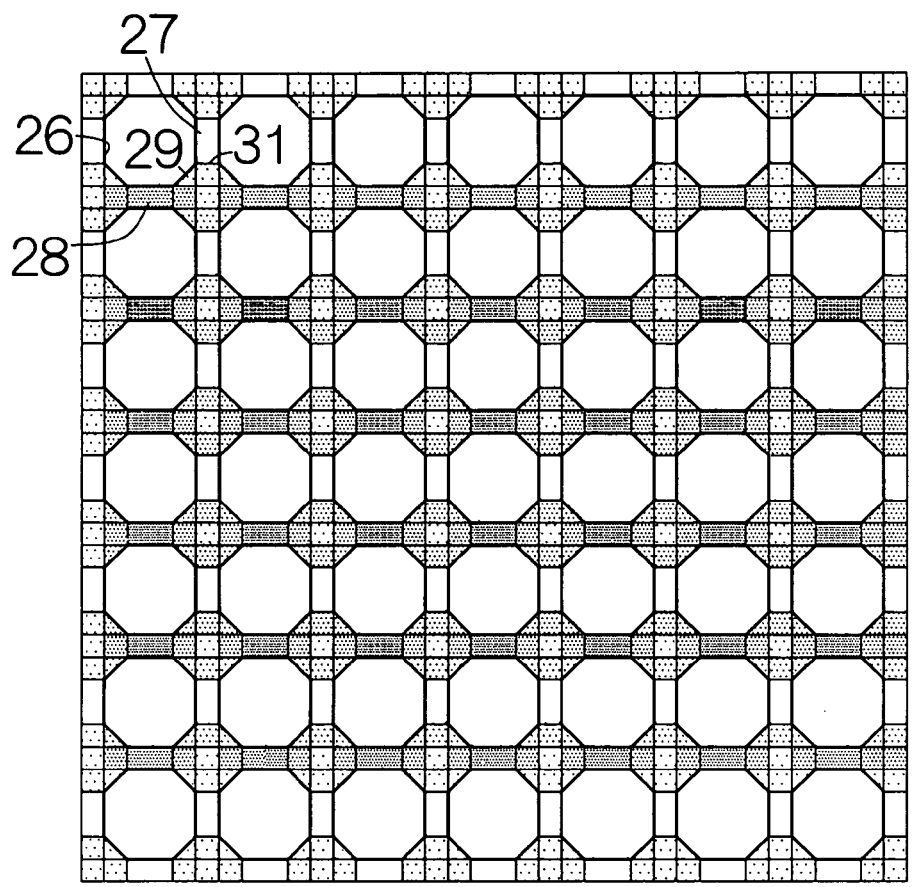
FIG. 10 is a schematic view of the vent grid for illustrating the distribution of the electric current over the vent grid.

Next, the inventors have observed the distribution of the electric current over the vent grid 25 of the second example based on simulation. As shown in FIG. 10, it has been confirmed that various quantity of the electric current was observed at the first and second electrically-conductive members 27, 28, the electrically-conductive pieces 29 and the crossing sections 31. In FIG. 10, the quantity of the electric current over the vent grid 25 was sorted based on the tone or shading. A darker or heavier shading corresponds to a larger quantity of the electric current. It has been confirmed that the electric current turns over at the boundary between the crossing section 31 and the first and second electrically-conductive members 27, 28 in the vent grid 25. It has been confirmed that the variation in the cross-sectional area induces imbalance of the characteristic impedance between the first and second electrically-conductive members 27, 28 and the crossing sections 31.

Figure 11:
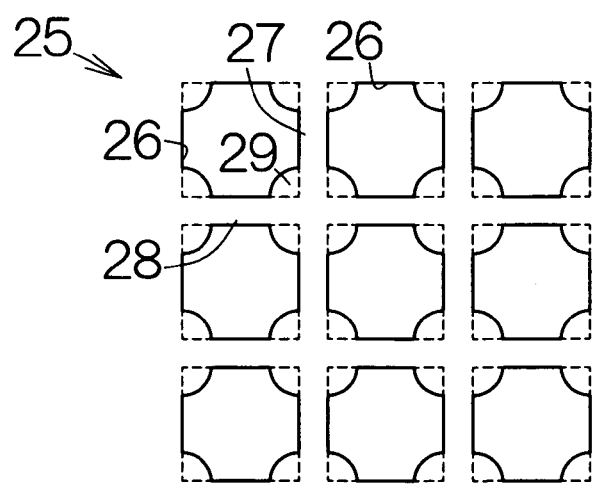
FIG. 11 is an enlarged partial plan view of the vent grid according to a modified embodiment of the present invention.

As shown in FIG. 11, the splay of the openings 26 may be defined based on a curve in the vent grid 25. The curve may bend outward from the straight line connecting the opposite ends of the splay. Alternatively, the curve may bend inward from the straight line connecting the opposite ends of the splay. The splay may take any shape as long as establishment of the splay induces imbalance of the characteristic impedance between the first and second electrically-conductive members 27, 28 and the crossing sections 31 in the vent grid 25.

What is claimed is:

1. An enclosure comprising a vent grid fitted in a wall of the enclosure, said vent grid comprising:

parallel first electrically-conductive members extending in a first direction, said first electrically-conductive members having a constant cross-sectional area;

parallel second electrically-conductive members extending in a second direction, intersecting with the first direction, so as to intersect with the first electrically-conductive members, said second electrically-conductive members having a constant cross-sectional area; and an electrically-conductive piece located at a corner of an opening surrounded by adjacent ones of the first electrically-conductive members and adjacent ones of the second electrically-conductive members, said electrically-conductive piece connecting first and second electrically-conductive members, intersecting with each other at the corner, to each other, wherein the electrically-conductive piece extends along the first and second electrically-conductive members from an apex of the corner.

2. The vent grid according to claim 1, wherein said electrically-conductive piece is integral to the first and second electrically-conductive members.

3. An electronic apparatus comprising:

an enclosure enclosing electronic circuit elements of the electronic apparatus:

a vent grid fitted in a wall of the enclosure, said vent grid comprising:

parallel first electrically-conductive members extending in a first direction, said first electrically-conductive members having a constant cross-sectional area;

parallel second electrically-conductive members extending in a second direction, intersecting with the first direction, so as to intersect with the first electrically-conductive members, said second electrically-conductive members having a constant cross-sectional area; and an electrically-conductive piece located at a corner of an opening surrounded by adjacent ones of the first electrically-conductive members and adjacent ones of the second electrically-conductive members, said electrically-conductive piece connecting first and second electrically-conductive members, intersecting with each other at the corner, to each others wherein the electrically-conductive piece extends along the first and second electrically-conductive members from an apex of the corner.

* * * * *